United States Patent
Akimoto et al.

(10) Patent No.: US 8,963,189 B2
(45) Date of Patent: Feb. 24, 2015

(54) SEMICONDUCTOR LIGHT EMITTING DEVICE AND METHOD FOR MANUFACTURING THE SAME

(75) Inventors: Yosuke Akimoto, Kanagawa-ken (JP); Akihiro Kojima, Kanagawa-ken (JP); Miyuki Izuka, Kanagawa-ken (JP); Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 361 days.

(21) Appl. No.: 13/052,250

(22) Filed: Mar. 21, 2011

(65) Prior Publication Data
US 2011/0297998 A1 Dec. 8, 2011

(30) Foreign Application Priority Data

Jun. 7, 2010 (JP) ................................ 2010-130481

(51) Int. Cl.
- H01L 33/00 (2010.01)
- H01L 33/62 (2010.01)
- H01L 27/15 (2006.01)
- H01L 33/48 (2010.01)

(52) U.S. Cl.
CPC .............. *H01L 33/62* (2013.01); *H01L 27/153* (2013.01); *H01L 33/486* (2013.01); *H01L 33/0079* (2013.01); *H01L 2924/0002* (2013.01)
USPC ................... 257/99; 257/88; 257/100

(58) Field of Classification Search
CPC ..... H01L 33/62; H01L 27/153; H01L 33/486; H01L 2924/0002; H01L 33/0079
USPC ............................ 257/81, 88, 99, 100; 438/28
See application file for complete search history.

(56) References Cited

U.S. PATENT DOCUMENTS

| | | |
|---|---|---|
| 2005/0194605 A1 | 9/2005 | Shelton et al. |
| 2006/0113548 A1 | 6/2006 | Chen et al. |
| 2006/0169993 A1 | 8/2006 | Fan et al. |
| 2010/0072489 A1 | 3/2010 | McLaurin et al. |
| 2010/0148198 A1 | 6/2010 | Sugizaki et al. |
| 2011/0233585 A1 | 9/2011 | Kojima et al. |
| 2011/0233586 A1 | 9/2011 | Kojima et al. |

FOREIGN PATENT DOCUMENTS

| | | |
|---|---|---|
| EP | 1 603 170 | 12/2005 |
| JP | 2000-244012 | 9/2000 |
| WO | 2006/030678 | 3/2006 |

OTHER PUBLICATIONS

Extended European Search Report for European Application No. 11159168.1 mailed on Oct. 25, 2011.
European Examination Report for Application No. 11159168.1 Dated Mar. 5, 2013, 7 pgs.
(Continued)

*Primary Examiner* — Jarrett Stark
(74) *Attorney, Agent, or Firm* — White & Case LLP (57) ABSTRACT

According to one embodiment, a semiconductor light emitting device includes a semiconductor layer, a first electrode, a second electrode, a first insulating layer, a first interconnect layer, a second interconnect layer, a first metal pillar, a second metal pillar and a second insulating layer. The semiconductor layer includes a first major surface, a second major surface opposite to the first major surface and a light emitting layer. An edge of a part of the first interconnect layer is exposed laterally from the first insulating layer and the second insulating layer.

8 Claims, 8 Drawing Sheets

(56) References Cited

OTHER PUBLICATIONS

European Examination Report for European Application No. 11159168.1 mailed on Oct. 2, 2012.

Chinese Office Action issued on May 28, 2013 in the counterpart Chinese patent application No. 201110070604 and an English translation thereof.

Taiwanese Office Action issued on Jul. 2, 2014 in corresponding Tawainese Application No. 100108112, along with English translation thereof.

SEMICONDUCTOR LIGHT EMITTING DEVICE AND METHOD FOR MANUFACTURING THE SAME

CROSS-REFERENCE TO RELATED APPLICATION

This application is based upon and claims the benefit of priority from Japanese Patent Application No. 2010-130481, filed on Jun. 7, 2010; the entire contents of which are incorporated herein by reference.

FIELD

Embodiments described herein relate generally to a semiconductor light emitting device and a method for manufacturing the same.

BACKGROUND

A semiconductor light emitting device which emits visible light or white light has become widely used for a illuminating device, a backlight for an image display and a display device and the like. In these fields, there are increasing demands for downsizing the device. Furthermore, productivity increase and cost reduction are required for replacing a fluorescent light and a filament lamp with the semiconductor light emitting device of less power consumption.

BRIEF DESCRIPTION OF THE DRAWINGS

FIG. 2A to FIG. 7 are schematic views illustrating a method for manufacturing the semiconductor light emitting device of the embodiment.

DETAILED DESCRIPTION

According to one embodiment, a semiconductor light emitting device includes a semiconductor layer, a first electrode, a second electrode, a first insulating layer, a first interconnect layer, a second interconnect layer, a first metal pillar, a second metal pillar and a second insulating layer. The semiconductor layer includes a first major surface, a second major surface opposite to the first major surface and a light emitting layer. The first electrode is provided on a region including the light emitting layer of the second major surface. The second electrode is provided on the second major surface. The first insulating layer is provided on the second major surface side of the semiconductor layer and includes a first opening communicating with the first electrode and a second opening communicating with the second electrode. The first interconnect layer is provided in the first opening in the first insulating layer and connected to the first electrode. The second interconnect layer is provided in the second opening in the first insulating layer and connected to the second electrode. The first metal pillar is provided on a face of the first interconnect layer opposite to the first electrode. The second metal pillar is provided on a face of the second interconnect layer opposite to the second electrode. The second insulating layer is provided between a side face of the first metal pillar and a side face of the second metal pillar. An edge of a part of the first interconnect layer is exposed laterally from the first insulating layer and the second insulating layer.

Embodiments will now be described with reference to the drawings. In the drawings, similar components are marked with the same reference numerals. A partial region in a wafer state is illustrated in the drawings showing manufacturing processes.

Figure 1:
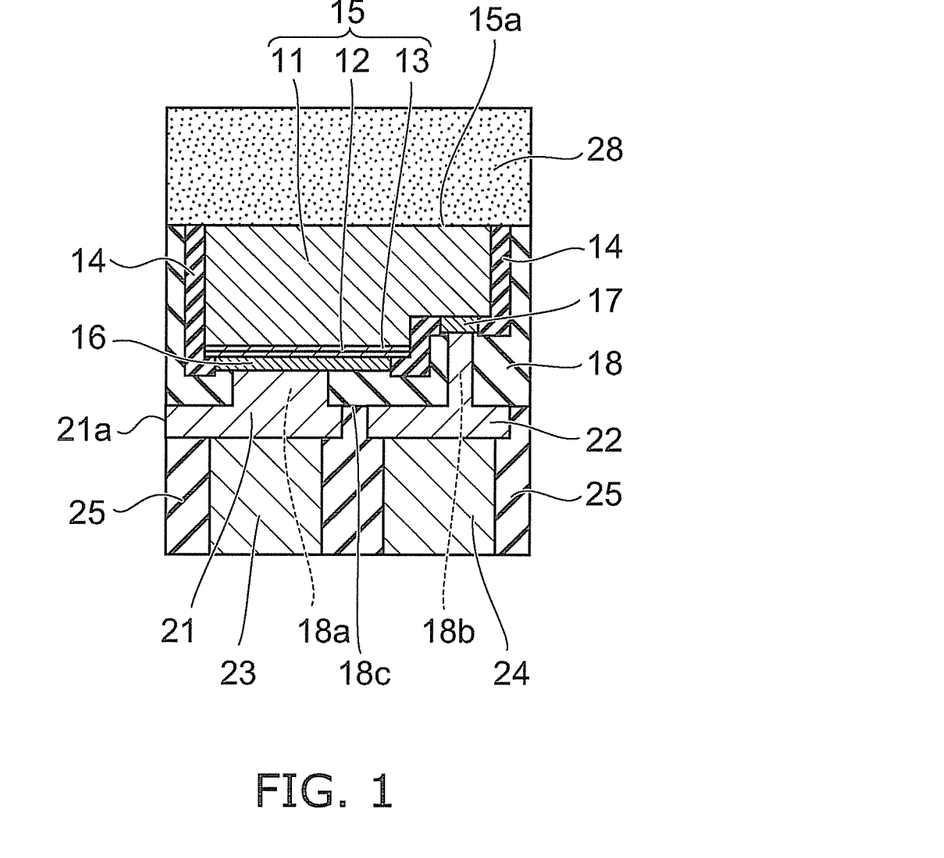
FIG. 1 is a schematic cross-sectional view illustrating a semiconductor light emitting device of an embodiment.

FIG. 1 is a schematic cross-sectional view illustrating a semiconductor light emitting device of an embodiment.

The semiconductor light emitting device of this embodiment includes a semiconductor layer 15. The semiconductor layer 15 includes a first major surface 15a and a second major surface formed on a side opposite to the first major surface 15a. Electrodes, interconnect layers and a resin layer are provided on the second major surface side, and light is mainly extracted from the first major surface 15a.

The semiconductor layer 15 includes a first semiconductor layer 11 and a second semiconductor layer 13. The first semiconductor layer 11 is, for example, an n-type GaN layer functioning as a lateral current path. However, the conductivity type of the first semiconductor layer 11 is not limited to the n-type and the conductivity type may be a p-type. The second semiconductor layer 13 includes a stacked structure interposing a light emitting layer (active layer) 12 between an n type layer and a p type layer.

The semiconductor layer 15 is patterned into a recessed and protruding configuration on the second major surface side; and an upper level portion and a lower level portion are provided on the second major surface side.

The upper level portion is located on an upper level side than the lower level portion in relation to the first major surface 15a. The upper level portion includes the light emitting layer 12. The lower level portion does not include the light emitting layer, and provided outside a periphery (an edge) of the light emitting layer 12.

A p-side electrode 16 is provided on the surface of the second semiconductor layer 13 (the surface of the upper level portion) as a first electrode. That is, the p-side electrode 16 is provided on a region including the light emitting layer 12. An n-side electrode 17 is provided on the surface of the first semiconductor layer 11 of the lower level portion as a second electrode. In one chip, i.e. the semiconductor layer 15, the p-side electrode 16 has a greater area than the n-side electrode 17. Thus the light emitting region can be increased.

A side surface of the semiconductor layer 15 and part of the second major surface are covered with insulating layers 14 and 18. The insulating layers 14 and 18 are also formed on a step portion between the p-side electrode 16 and the n-side electrode 17. The insulating layer 14 includes, for example, silicon dioxide or silicon nitride. The insulating layer 18 includes, for example, a resin such as a polyimide or the like, which is superior in patterning a fine opening. Alternatively, the insulating layer 18 may be also based on silicon oxide. The insulating layer 14 does not cover the p-side electrode 16 and the n-side electrode 17.

A p-side interconnect layer 21 is provided as a first interconnect layer on a surface 18c of the insulating layer 18 opposite to the first semiconductor layer 15. An n-side interconnect layer 22 is provided as a second interconnect layer on a surface 18c of the insulating layer 18 opposite to the first semiconductor layer 15. The p-side interconnect layer 21 is provided also in a first opening 18a, which communicates with the p-side electrode 16 through the insulating layer 18 and the p-side interconnect layer 21 is connected to the p-side electrode 16. The n-side interconnect layer 22 is also provided in a second opening 18b, which communicates with the n-side electrode 17 through the insulating layer 18 and the n-side interconnect layer 22 is connected to the n-side electrode 17.

A p-side metal pillar 23 is provided as the first metal pillar on a face of the p-side interconnect layer 21 opposite to the p-side electrode 16. An n-side metal pillar 24 is provided as a second metal pillar on a face of the n-side interconnect layer 22 opposite to the n-side electrode 17.

For example, a resin layer 25 covers the periphery of the p-side metal pillar 23, the periphery of the n-side metal pillar 24, a surface of the p-side interconnect layer 21, and a surface of the n-side interconnect layer 22, as the second insulating layer. A gap between the neighboring pillars is filled with the resin layer 25. Each end face of the p-side metal pillar 23 and the n-side metal pillar 24 is exposed from the resin layer 25. The second insulating layer may be made of the same material as the first insulating layer (the insulating layer 18).

An end face 21a of a part of the p-side interconnect layer 21 is exposed laterally from the resin layer 25 and also exposed laterally from the insulating layer 18. The end face 21a of the part of the p-side interconnect layer 21 is not covered with the insulating layer 18 and the resin layer 25. All end faces of the n-side interconnect layer 22 are covered with the resin layer 25 or the insulating layer 18.

The n-side interconnect layer 22 is connected to the n-side electrode 17 which is provided on the portion not including the light emitting layer 12 of the semiconductor layer 15. An area of the n-side interconnect layer 22 opposite to the n-side electrode 17 is greater than an area on the n-side electrode side. That is, a contact area between the n-side interconnect layer 22 and the n-side metal pillar 24 is greater than a contact area between the n-side interconnect layer 22 and the n-side electrode 17. A contact area between the p-side interconnect layer 21 and p-side metal pillar 23 is greater than a contact area between the p-side interconnect layer 21 and the p-side electrode 16. Alternatively the contact area between the p-side interconnect layer 21 and p-side metal pillar 23 may be smaller than the contact area between the p-side interconnect layer 21 and the p-side electrode 16. A part of the n-side interconnect layer 22 extends on the surface 18c of the insulating layer 18 to a position facing a portion under the light emitting layer 12.

Thereby, an enlarged extracted electrode can be formed from the n-side electrode 17 provided on a small area of the portion not including the light emitting layer 12 of the semiconductor layer 15, via the n-side interconnect layer 22, while keeping a high light output with the larger light emitting layer 12.

The first semiconductor layer 11 is electrically connected to the n-side metal pillar 24 via the n-side interconnect layer 22 and the n-side electrode 17. The second semiconductor layer 13 is electrically connected to the p-side metal pillar 23 via the p-side electrode 16 and the p-side interconnect layer 21.

A surface treatment film (for example, electroless plating of film such as Ni or Au, pre-coated solder or the like) may be formed on each lower face of the p-side metal pillar 23 and the n-side metal pillar 24, so as to avoid rusting.

The materials of the n-side interconnect layer 22, the p-side interconnect layer 21, the n-side metal pillar 24 and the p-side metal pillar 23 may include copper, gold, nicke, silver, etc. Among these materials, it is preferable to use copper having good thermal conductivity, high resistance for migration and superior adhesion to insulating materials.

Patterning the plurality of fine openings 18a and 18b is performed on the insulating layer 18. Thus, it is preferable for the insulating layer 18 to use, for example, a resin such as a polyimide having excellent patternability.

It is preferable to use a resin capable to be formed as a thick layer with low cost and suitable for reinforcing the n-side metal pillar 24 and the p-side metal pillar 23. Examples of the resin layer 25 may include epoxy resin, silicone resin, fluorine resin, etc.

A fluorescent layer 28 is provided on the first major surface 15a of the semiconductor layer 15. The fluorescent layer 28 is capable of absorbing light from the light emitting layer 12 and emitting wavelength-converted light. Therefore, it is possible to externally emit mixed light containing the light from the light emitting layer 12 and the wavelength-converted light from the fluorescent layer 28. In the case where, for example, the light emitting layer 12 is nitride-based, it is possible to obtain white light, lamp light, etc., as mixed-color light of blue light from the light emitting layer 12 and yellow light from, for example, wavelength-converted light of the fluorescent layer 28. The fluorescent layer 28 may includes multiple types of phosphors (e.g., red phosphor and green phosphor).

The light emitted from the light emitting layer 12 mainly propagates through the first semiconductor layer 11, the first major surface 15a, the transparent resin 27 and the fluorescent layer 28 to be emitted externally.

The lower faces of the p-side metal pillar 23 and the n-side metal pillar 24 can be bonded to circuit formed on a mounting board or a circuit board via ball-shaped or bump-shaped external terminals such as, for example, solder or other metals. Thereby, the semiconductor light emitting device may receive electrical power.

Each thickness of the n-side metal pillar 24 and the thickness of the p-side metal pillar 23 (the thickness in the vertical direction of FIG. 1) is thicker than the thickness of the stacked body including the semiconductor layer 15, the n-side electrode 17, the p-side electrode 16, the insulating layer 14, the insulating layer 18, the n-side interconnect layer 22, and the p-side interconnect layer 21. The aspect ratios (the ratio of the thickness to the planar size) of the metal pillars 23 and 24 are not limited to being 1 or more, and the aspect ratios may be less than 1. The thickness of the metal pillars 23 and 24 may be thinner than the planar sizes thereof.

According to the structure of this embodiment, even if the semiconductor layer 15 is thin, it is possible to keep the mechanical strength by forming the n-side metal pillar 24, the p-side metal pillar 23 and the resin layer 25 to be thick. In the case where the semiconductor light emitting device is mounted on the mounting board, the n-side metal pillar 24 and the p-side metal pillar 23 can absorb and mitigate the stress applied to the semiconductor layer 15 via the external terminals.

FIG. 1 illustrates a chip of the semiconductor light emitting device. In this embodiment, as described later, all device elements shown in FIG. 1 are collectively formed in a wafer state and the wafer is divided into a plurality of the chips. Therefore, it may be possible to obtain miniaturized light emitting device which is as small as the semiconductor layer 15 (i.e., bare chip).

When the diced semiconductor light emitting device is mounted on the mounting board, the lower faces of the p-side metal pillar 23 and the n-side metal pillar 24 exposed from the resin layer 25 are bonded to the circuit provided on the mounting board in response to respective polarities. Thus, each of the p-side metal pillar 23 and the n-side metal pillar is necessary to be distinguished from the other. However, the side surfaces of the metal pillars are covered with the resin layer 25 and only the lower faces are exposed. Therefore, it is difficult to distinguish between both pillars downsized.

In this embodiment, the end face 21a of the part of the p-side interconnect layer 21 provided below the p-side metal pillar 23 is exposed from the resin layer 25. In contrast, the all end faces of the n-side interconnect layer 22 provided below the n-side metal pillar 24 are covered with the resin layer 25 and not exposed. Therefore, it can be easily distinguished which metal pillar is the p-side or the n-side by recognizing the end face 21a exposed to the side surface of the resin layer 25. As a result, the mounting becomes easy, the productivity is increased and the production cost can be reduced.

A method for manufacturing the semiconductor light emitting device of the embodiment will now be described with reference to FIG. 2A to FIG. 7.

Figure 2A:
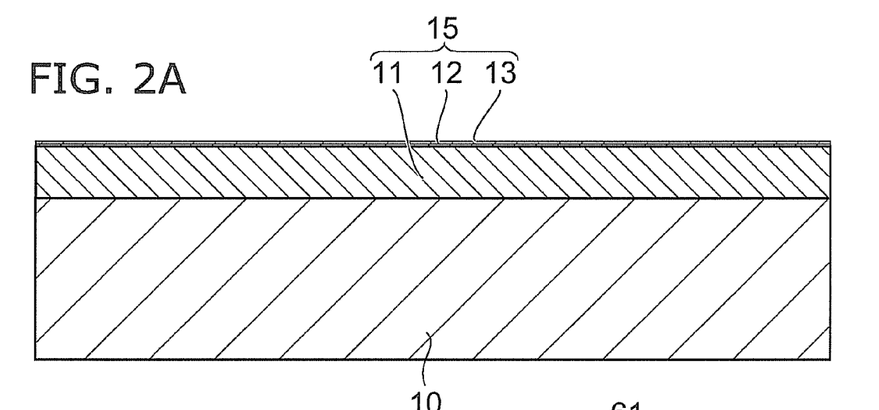

As illustrated in FIG. 2A, the first semiconductor layer 11 is grown on the major surface of a substrate 10 and the light emitting layer 13 including the second semiconductor layer 12 is grown thereupon. In the case where such layers of the semiconductor layer 15 are, for example, made of nitride semiconductors, the semiconductor layer 15 may be epitaxially formed on a sapphire substrate.

Figure 2B:
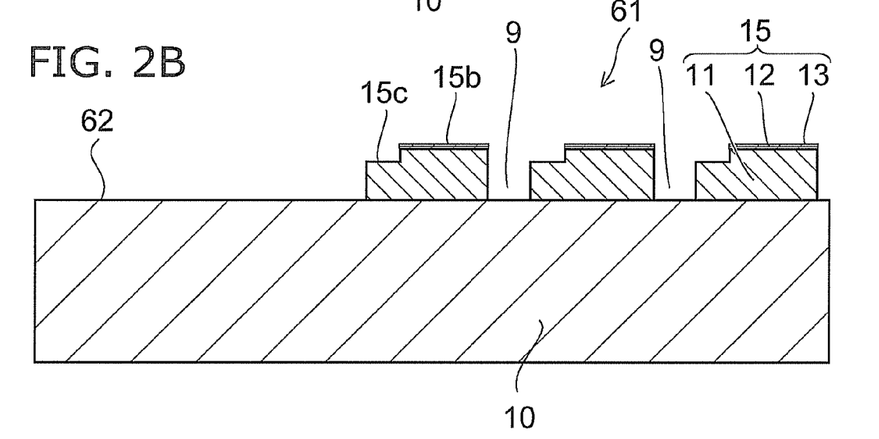
Figure 2C:
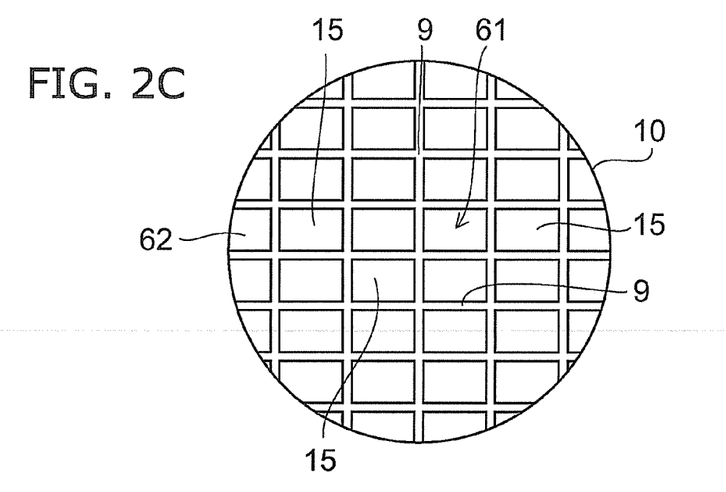

Then, as illustrated in FIG. 2B, a separating trench 9 is formed to pierce the semiconductor layer 15 and reach the substrate 10 by, for example, Reactive Ion Etching (RIE) using a not-illustrated resist as a mask. As illustrated in FIG. 2C, the separating trench 9 is formed, for example, in a lattice configuration on the substrate 10 to multiply-separate the semiconductor layer 15.

Then, a part of the second semiconductor layer 13 including the light emitting layer 12 is removed by, for example, RIE using the not-illustrated resist to expose a part of the first semiconductor layer 11. Thereby, the upper level portion 15b is formed on the second major surface side of the semiconductor layer 15. The upper level portion 15b is positioned relatively in the upper level as viewed from the substrate 10. The lower level portion 15c is formed on the second major surface side of the semiconductor layer 15. The lower level portion 15c is positioned more in the lower level on the substrate 10 side than the upper level portion 15b. The upper level portion 15b includes the light emitting layer 12, and the lower level portion 15c does not include the light emitting layer 12.

The substrate 10 includes a device region 61. The plurality of the semiconductor layers 15 are formed on the device region 61. An outer circumferential region 62 is outside the device region 61. FIGS. 2A and 2B, FIGS. 3A and 3B, FIG. 4A, FIG. 5A, FIG. 6A and FIG. 7 illustrate cross-sections of a region near to the outer circumferential region 62.

Figure 3A:
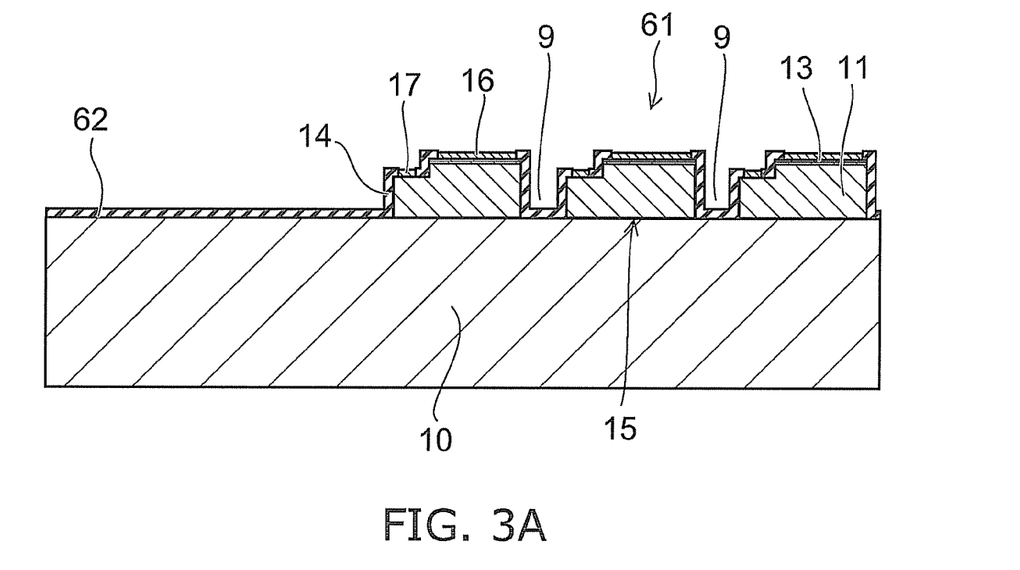

The insulating layer 14 shown in FIG. 3A covers the major surface of the substrate 10, the side face and the second major surface of the semiconductor layer 15. Then, after selectively removing the insulating layer 14, the p-side electrode 16 is formed on a surface of the upper level portion 15b (the surface of the second semiconductor layer 13), and the n-side electrode 17 is formed on a surface of the lower level portion 15c (the surface of the first semiconductor layer 11). One of the p-side electrode 16 and the n-side electrode 17 can be formed prior to the other, and alternatively the p-side electrode 16 and n-side electrode 17 may be formed simultaneously with the same material.

Figure 3B:
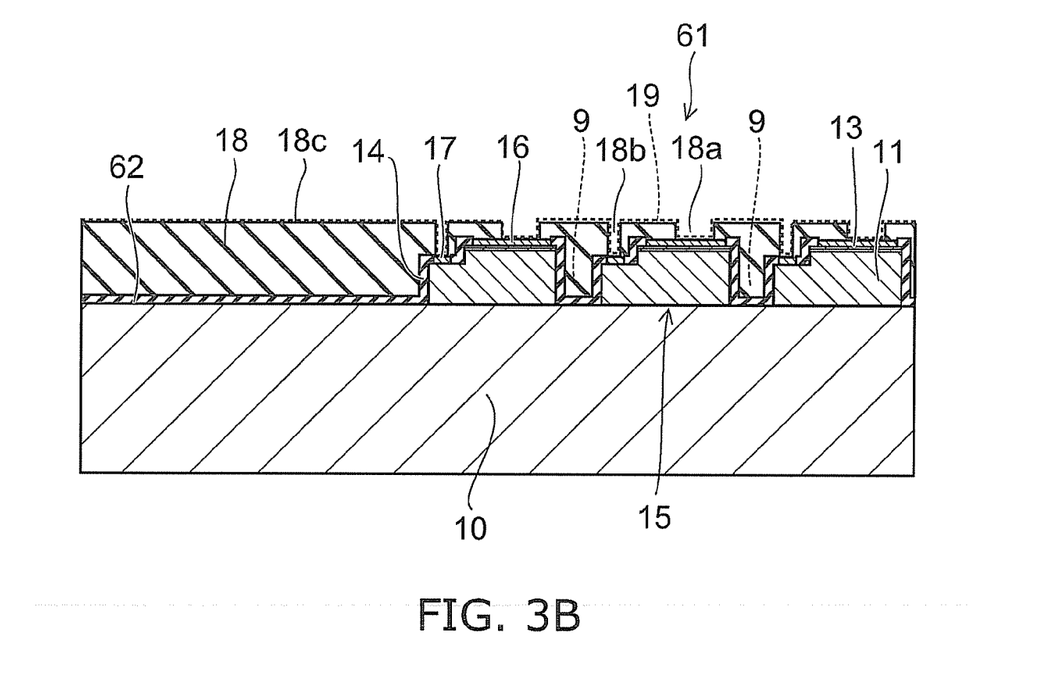

The insulating layer 18 shown in FIG. 3B covers all exposed surfaces on the substrate 10. Then, the insulating layer 18 is patterned by, for example, wet etching to form the first opening 18a and the second opening 18b selectively in the insulating layer 18. The first opening 18a reaches the p-side electrode 16, and the second opening 18b reaches the n-side electrode 17. The separating trench 9 is filled with the insulating layer 18.

Then, as shown by a dot line in FIG. 3B, a continuous seed metal 19 is formed on the surface 18c of the insulating layer 18 and on the inner faces of the first opening 18a and the second opening 18b. And after selectively forming not-illustrated plating resist on the seed metal 19, Cu plating is performed using the seed metal 19 as a current path.

Figure 4A:
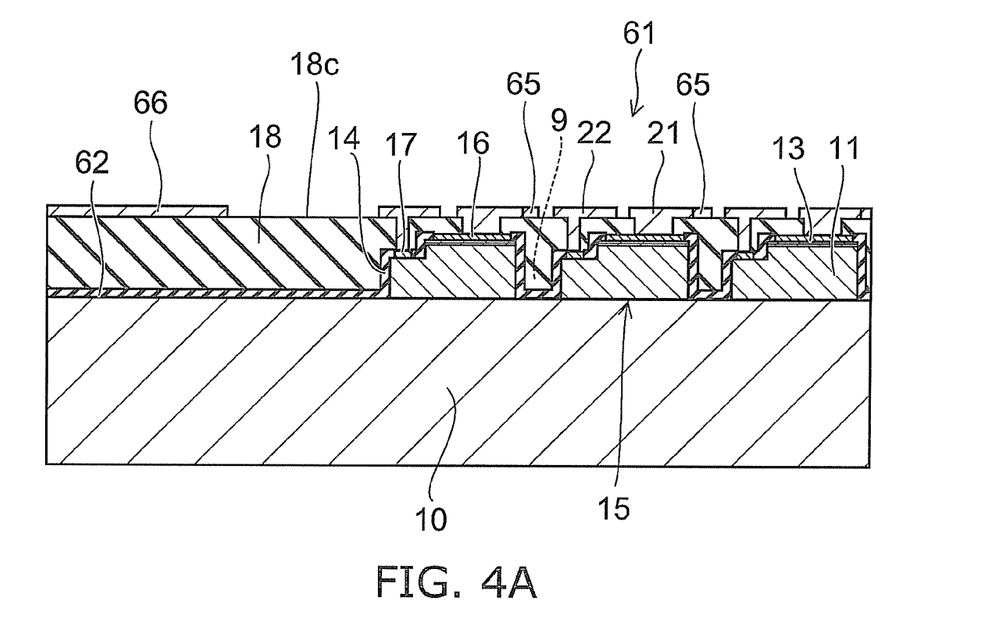
Figure 4B:
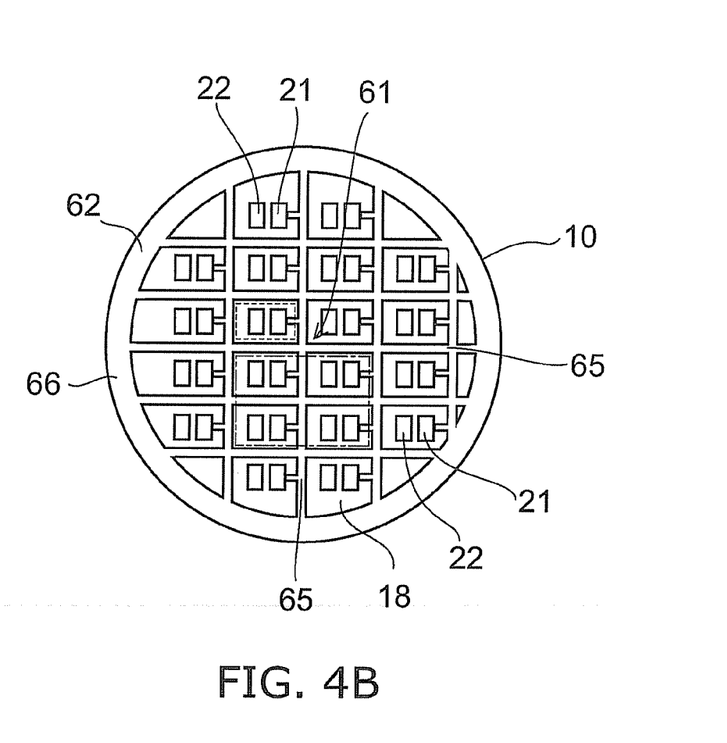

Thereby, as illustrated in FIG. 4A and FIG. 4B (plan view of the entire wafer), the p-side interconnect layer 21 and the n-side interconnect layer 22 are formed selectively on the surface 18c of the insulating layer 18. The p-side interconnect layer 21 is formed also in the first opening 18a and connected to the p-side electrode 16. The n-side interconnect layer 22 is formed also in the second opening 18b and connected to the n-side electrode 17.

The face of the n-side interconnect layer 22 on the side opposite to the n-side electrode 17 is formed into a pad shape with a greater area than the face connecting to the n-side electrode 17. Similarly, the face of the p-side interconnect layer 21 on the side opposite to the p-side electrode 16 is formed into the pad shape with a greater area than the face connecting to the p-side electrode 16.

The p-side interconnect layer 21 and the n-side interconnect layer 22 are simultaneously formed with copper material by using plating method. Furthermore, during the plating of the p-side interconnect layer 21 and the n-side interconnect layer 22, an inside interconnection 65 and an outer circumferential interconnection 66 are simultaneously formed on the surface 18c of the insulating layer 18. The p-side interconnect layer 21, the n-side interconnect layer 22, the inside interconnection 65 and the outer circumferential interconnection 66 are made of the same material (for example, copper) and have almost the same thickness. Further the p-side interconnect layer 21 and the n-side interconnect layer 22 are not limited to be simultaneously formed and alternatively one of the p-side interconnect layer 21 and the n-side interconnect layer 22 may be formed prior to the other.

The inside interconnection 65 is formed in a dicing region where the separation trench 9 is formed, of the device region 61. The inside interconnection 65 is formed, for example, in a lattice configuration. The outer circumferential interconnection 66 is formed on the surface 18c of the insulating layer 18 located in the outer circumferential region 62. The outer circumferential interconnection 66 is continuously formed along a circumferential direction of the outer circumferential region 62, and encloses the device region 61 with the continuous closed pattern.

The inside interconnection 65 is integrally connected to a part of the p-side interconnect layer 21. Furthermore, end portions of the inside interconnection 65 on the outer circumferential region 62 side are integrally connected to the outer circumferential interconnection 66. Hence, the p-side interconnect layer 21 is electrically connected to the outer circumferential interconnection 66 via the inside interconnection 65. The n-side interconnect layer 22 is not connected to any one of the p-side interconnect layer 21, the inside interconnection 65 and the outer circumferential interconnection 66.

Then, another plating resist (not-illustrated) is selectively formed on the insulating layer 18 for making the metal pillars, and Cu plating is performed using the seed metal 19 mentioned above as a current path.

Figure 5A:
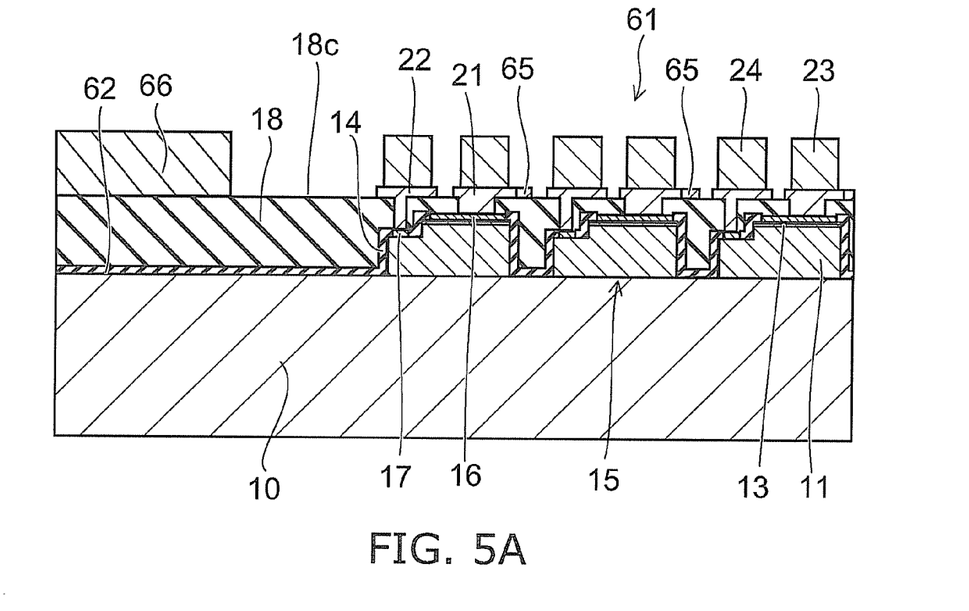
Figure 5B:
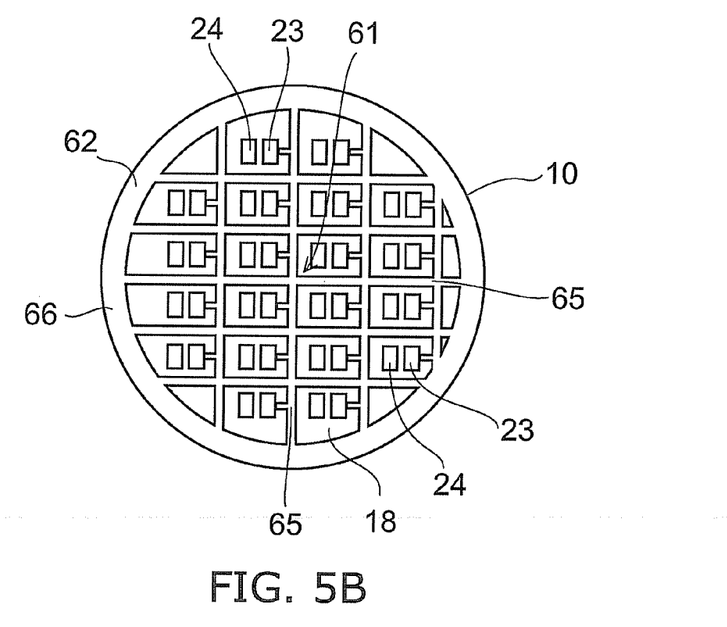

Thereby, as illustrated in FIG. 5A and FIG. 5B (plan view of the entire wafer), the p-side metal pillar 23 is formed on the p-side interconnect layer 21, and the n-side metal pillar 24 is formed on the n-side interconnect layer 22. Further, during the plating, the metal is also formed on the outer circumferential interconnection 66. The p-side metal pillar 23, the n-side metal pillar 24 and the metal formed on the outer circumferential interconnection 66 contain, for example, copper material.

During this plating, the inside interconnection 65 is covered with a resist in order to avoid the metal plating, whereby the p-side metal pillar 23 is not provided on the inside interconnection 65. Hence, the outer circumferential interconnection 66 becomes thicker than the inside interconnection 65. The thickness of the outer circumferential interconnection 66 is almost the same with the total thickness of the p-side interconnect layer 21 and p-side metal pillar 23 or the total thickness of the n-side interconnect layer 22 and the n-side metal pillar 24. Because the relatively thick metal layer is continuously formed in the circumferential direction on the outer circumferential region 62 of the wafer, the mechanical strength of the wafer is increased and warp in the wafer is suppressed. Thereby, the subsequent processes are easily performed.

After this plating, using the p-side interconnect layer 21, the n-side interconnect layer 22, the p-side metal pillar 23, the n-side metal pillar 24, the inside interconnection 65 and the outer circumferential interconnection 66 as a mask, the seed metal 19 exposed on the surface 18c of the insulating layer 18 is wet-etched. Thereby, the electrical connection between the p-side (the p-side interconnect layer 21, the inside interconnection 65 and the outer circumferential interconnection 66) and the n-side interconnect layer 22 via the seed metal 19 is divided.

Figure 6A:
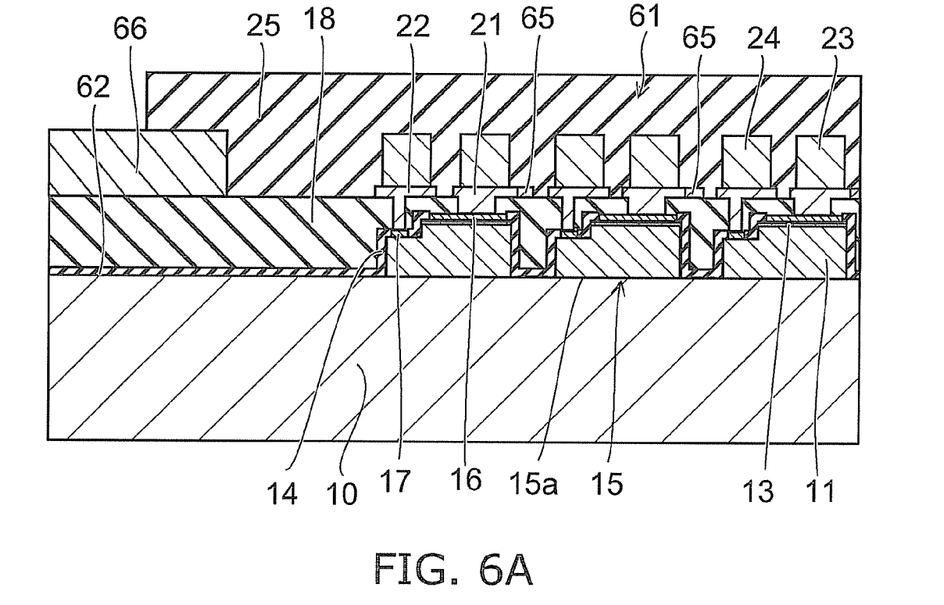
Figure 6B:
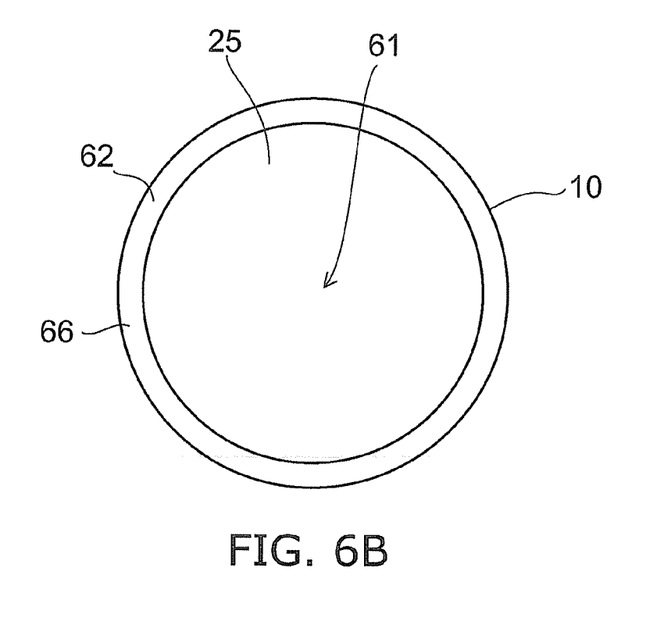

Subsequently, as illustrated in FIG. 6A and FIG. 6B (plan view of the entire wafer), the resin layer 25 is formed on the insulating layer 18. The resin layer 25 covers all of the p-side interconnect layer 21, the n-side interconnect layer 22, the p-side metal pillar 23, the n-side metal pillar 24 and the inside interconnection 65. The resin layer 25 is filled in a gap between the p-side metal pillar 23 and the n-side metal pillar 24, a gap between the p-side interconnect layer 21 and the n-side interconnect layer 22, a gap between the n-side interconnect layer 22 and the inside interconnection 65 and a gap between the p-side interconnect layer 21 and the inside interconnection 65. The resin layer 25 also covers the inside portion of the outer circumferential interconnection 66. That is, the resin layer 25 covers a portion on the device region 61 side of the outer circumferential interconnection 66. The outside portion of the outer circumferential interconnection 66 is not covered with the resin layer 25 and exposed.

Figure 8A:
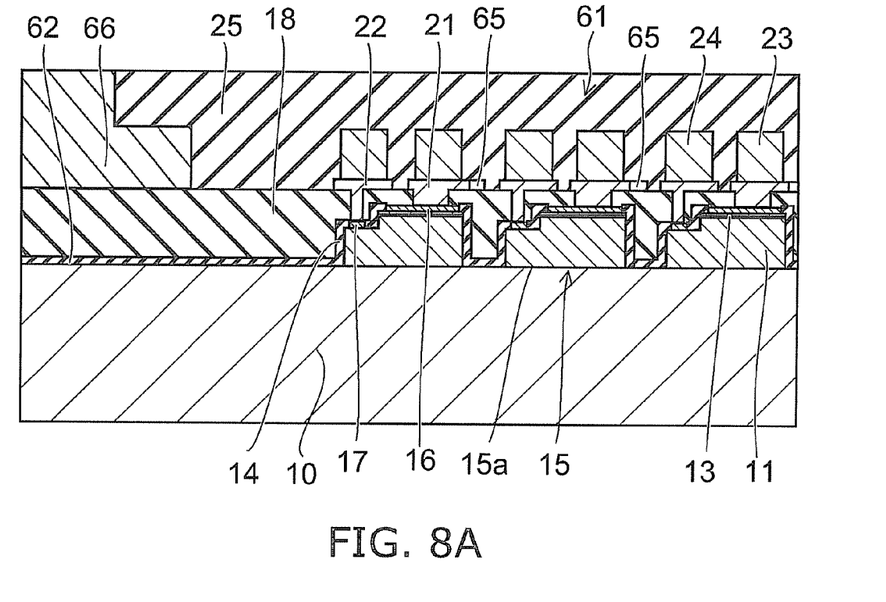
FIG. 8A and FIG. 8B are schematic cross-sectional views illustrating a semiconductor light emitting device of to another embodiment.

Furthermore, additional copper plating may be performed on the outside portion of the outer circumferential interconnection 66 exposed from the resin layer 25 after forming the resin layer 25, whereby the outer circumferential interconnection 66 becomes thicker as illustrated in FIG. 8A. The increase of the thickness of the outer circumferential interconnection 66 strengthens the mechanical strength of the wafer.

Subsequently, the substrate 10 is removed. The substrate 10 is removed, for example, by using laser lift-off method. Specifically, laser light is irradiated from the backside of the substrate 10 toward the first semiconductor layer 11. The substrate 10 transmits the laser light and the laser light has a wavelength in the absorption region with respect to the first semiconductor layer 11.

When the laser light reaches the interface between the substrate 10 and the first semiconductor layer 11, the first semiconductor layer 11 proximal to the interface absorbs the energy of the laser light and decomposes. In the case where the first semiconductor layer 11 is made of a metal nitride (for example, GaN), the first semiconductor layer 11 decomposes into Ga and nitrogen gas. A micro gap is formed between the substrate 10 and the first semiconductor layer 11 by the decomposition reaction, and the first semiconductor layer 11 is separated from the substrate 10.

The irradiation of the laser light is performed over the entire wafer by performing multiply for each set region, and the substrate 10 is removed. Thereby, extraction efficiency of the emitting light from the semiconductor layer 15 may be improved, owing to the removal of the substrate 10 from the first major surface 15a.

Figure 7:
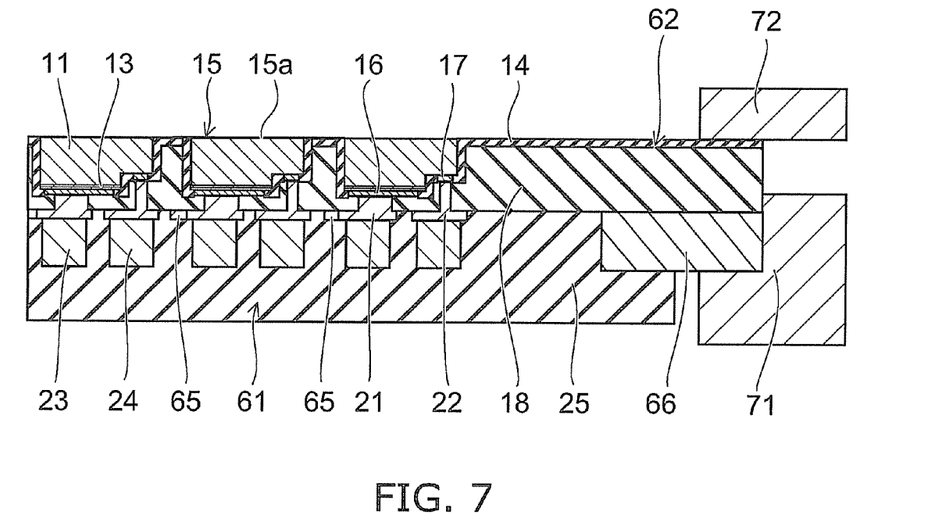

Subsequently, the voltage is applied between the first major surface 15a exposed by the removal of the substrate 10, and the exposed portion of the outer circumferential interconnection 66 on the outer circumferential region 62. Thus the light emitting layer 12 emits light and the optical characteristics of the light emitted from the first major surface 15a are measured.

Specifically, as shown in FIG. 7, the surface of the outer circumferential interconnection 66 exposed from the resin layer 25 is supported by, for example, a ring-shaped measurement electrode 71. The outside circumferential surface of the insulating layer 14 exposed by removing the substrate 10, is pressed by, for example, a ring-shaped pressure member 72 onto the measurement electrode 71 side. Thereby the surface of the outer circumferential interconnection 66 is closely contacted to the measuring electrode 71 and good electrical contact between the outer circumferential interconnection 66 and the measuring electrode 71 is ensured. The positive potential is applied to the outer circumferential interconnection 66 via the measuring electrode 71 and the ground potential is applied to the first major surface 15a of each semiconductor layer 15 via a not illustrated probe contacted with the first major surface 15a.

When GaN is decomposed by the irradiation with the laser light described above a gallium (Ga) film remains on the first major surface 15a. The gallium film may usually reduce the light output, so the gallium film is removed. However, in this embodiment, the gallium film is remained during the above measurement and a negative side measurement electrode (probe) is contacted to the gallium film. Thereby, the contact resistance can be reduced more comparing with contacting the probe to GaN.

The outer circumferential interconnection 66 is connected to the p-side interconnect layer 21 via the inside interconnection 65. Therefore, by applying the above voltage, holes from the second semiconductor layer 13 side and electrons from the first semiconductor layer 11 side are injected into the light emitting layer 12. Thereby, the light generated by recombination of the holes and the electrons, is emitted from the light emitting layer 12. The wavelength is measured, for example, as the optical characteristics of the emitting light emitted from the first major surface 15a.

For the hole-injection into the light emitting layer 12, it may be possible to apply the voltage to the p-side metal pillar 23. This requires thinning the resin layer 25 and exposing the lower face of the p-side metal pillar 23. However, the thinning the resin layer 25 induces thinning the entire wafer. Wafer handling becomes difficult and productivity declines.

In this embodiment, as described above, by forming the outer circumferential interconnection 66 connected to the p-side interconnect layer 21 on the outer circumferential region 62, it becomes possible to apply the voltage to the p-side interconnect layer 21 via the outer circumferential interconnection 66, even if the p-side metal pillar 23 is covered with the resin layer 25. Thereby, while ensuring the wafer strength by the relatively thick resin layer 25, the measurements can be performed and productivity decline can be avoided.

After measuring the optical characteristics, the first major surface 15a is cleaned and the gallium film remaining on the first major surface 15a is removed. The first major surface 15a may be roughened to improve the extraction efficiency.

Continuing, as illustrated in FIG. 1, the fluorescent layer 28 is formed on the first major surface 15a. For example, a liquid transparent resin containing dispersed phosphor particles is applied by using spin coating method and subsequently cured to be the fluorescent layer 28 by heat treatment. The transparent resin transmits the light emitted from the light emitting layer 12 and the phosphor particles.

At this time, it is possible to adjust the thickness of the fluorescent layer 28 on the basis of the result of the optical characteristics mentioned above. For example, there may be a wafer-to-wafer variation in the wavelength of the light from the light emitting layer 12, owing to variations in wafer processing. In that case, the light of the desired color can be controlled to be extracted by adjusting the thickness of the fluorescent layer 28 on the basis of the result of the emission wavelength measurement.

There may also be the case where the emission wavelength varies in each semiconductor layer 15 within one wafer and, in that case, the thickness of the fluorescent layer 28 may be partially adjusted on the basis of the emission wavelength in each semiconductor layer 15. For example, a transparent material (transparent resin or glass) which transmits the emitting light can be formed on the first major surface 15a with an adjusted thickness corresponding to the emission wavelength from each semiconductor layer 15. Subsequently the fluorescent layer 28 is formed over the entire wafer so as to have a planarized surface, whereby the portion with a transparent layer formed becomes thin compared with the portion without the transparent layer. Further, the fluorescent layer 28 becomes thin with increasing the thickness of the transparent layer.

Then, after forming the fluorescent layer 28, the resin layer 25 is polished, whereby the lower faces of the p-side metal pillar 23 and the n-side metal pillar 24 are exposed. The processes described above are performed in the wafer state.

Subsequently, dicing is performed along the separating trench 9 (FIGS. 2B and 2C) to singulate the wafer. At the dicing, the substrate 10 is already removed. The separating trench 9 does not contain a part of the semiconductor layer 15. And the separating trench 9 is filled with a resin as the insulating layer 18. Thus, the dicing may be easily performed and the productivity can be improved. Furthermore, damage to the semiconductor layer 15 can be avoided during the dicing. Furthermore, after the singulation, the device structure in which the side faces of the semiconductor layer 15 are covered with the insulating layer 18 and protected is obtained.

The inside interconnection 65 is formed in the dicing region and the dicing width is almost the same as the width of the inside interconnect layer 65 or wider than the width of the inside interconnect layer 65. In that case, the diced chip is formed not to include the inside interconnect layer 65. Furthermore, since the p-side interconnect layer 21 is cut at the portion connected to the inside interconnect layer 65, the end face 21a of the part of the p-side interconnect layer 21 is exposed from the resin layer 25. Thereby, the p-side interconnect layer 21 can be distinguished from the n-side interconnect layer 22 in which all end faces are covered with the resin layer 25 also after the sigulation.

As illustrated by dot lines in FIG. 4B, the singulated semiconductor light emitting device may have a single-chip structure including one semiconductor layer 15, or as illustrated by dashed lines in FIG. 4B, may have a multi-chip structure including multiple semiconductor layers 15.

Because the processes described above up to the dicing are performed collectively in the wafer state, it is unnecessary to perform re-interconnecting electrodes and packaging for each of the singulated semiconductor light emitting devices, and it is possible to drastically reduce production costs. In other words, the re-interconnecting electrodes and the packaging is already completed in the wafer state. Also, inspections are possible at the wafer level. Therefore, the productivity can be increased, resulting in easy cost.

In the wafer state, the p-side interconnect layers 21 of all chips are unnecessary to be connected to the outer circumferential interconnection 66 and it is sufficient to connect at least the p-side interconnect layer 21 of the chip for measurement the optical characteristics to the outer circumferential interconnection 66.

Figure 8B:
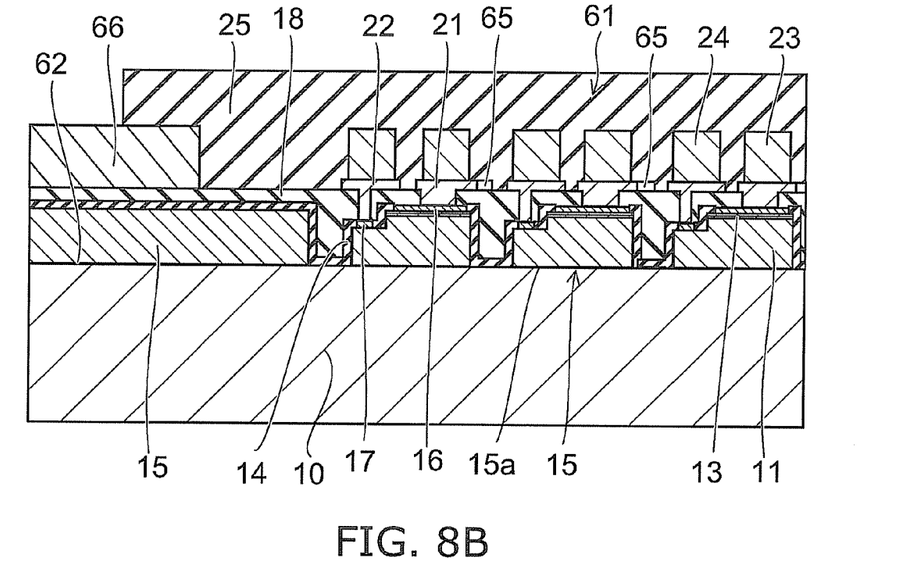

As illustrated in FIG. 8B, the semiconductor layer 15 may remain on the outer circumferential region 62 of the substrate 10. The semiconductor layer 15 is provided as a dummy layer without electrodes, which does not function as the light emitting device.

The semiconductor layer 15 remaining on the outer circumferential region 62 prevents the resin layer 25 from being irradiated with the laser light during the laser lift-off process. This can suppress an induced crack and the like in the resin layer 25 in the outer region 62.

The fluorescent layer 28 may include examples of the layers described below, such as a red fluorescent layer, a yellow fluorescent layer, a green fluorescent layer and a blue fluorescent layer.

The red fluorescent layer may contain, for example, a nitride-based phosphor of $CaAlSiN_3$:Eu or a SiAlON-based phosphor.

In the case where a SiAlON-based phosphor is used, it may be used $$(M_{1-x}R_x)_{a1}AlSi_{b1}O_{c1}N_{d1} \quad \text{Compositional Formula (1)}$$

where M is at least one type of metal elements excluding Si and Al, and it may be desirable for M to be at least one selected from Ca and Sr; R is a light emission center element, and it may be desirable for R to be Eu; and x, a1, b1, c1, and d1 satisfy following relationships $0<x\leq1$, $0.6<a1<0.95$, $2<b1<3.9$, $0.25<c1<0.45$, and $4<d1<5.7$.

By using the SiAlON-based phosphor represented by compositional formula (1), temperature characteristics of the wavelength conversion efficiency can be improved, and the efficiency in the high current density region can be improved further.

The yellow fluorescent layer may contain, for example, a silicate-based phosphor of $(Sr, Ca, Ba)_2SiO_4$:Eu.

The green fluorescent layer may contain, for example, a halophosphate-based phosphor of $(Ba, Ca, Mg)_{10}(PO_4)_6 \cdot Cl_2$:Eu or a SiAlON-based phosphor.

In the case where a SiAlON-based phosphor is used, may be used $$(M_{1-x}R_x)_{a2}AlSi_{b2}O_{c2}N_{d2} \quad \text{Compositional Formula (2)}$$

where M is at least one type of metal elements excluding Si and Al, and it may be desirable for M to be at least one selected from Ca and Sr; R is a light emission center element, and it may be desirable for R to be Eu; and x, a2, b2, c2, and d2 satisfy following relationships $0<x\leq1$, $0.93<a2<1.3$, $4.0<b2<5.8$, $0.6<c2<1$, and $6<d2<11$.

By using the SiAlON-based phosphor of compositional formula (2), temperature characteristics of the wavelength conversion efficiency can be improved, and the efficiency in the high current density region can be improved further.

The blue fluorescent layer may contain, for example, an oxide-based phosphor of $BaMgAl_{10}O_{17}$:Eu.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   a plurality of semiconductor layers, each of the semiconductor layers including a first major surface, a second major surface opposite to the first major surface and a light emitting layer;
   a plurality of first electrodes, each of the first electrodes provided on a region including the light emitting layer of the second major surface;
   a plurality of second electrodes, each of the second electrodes provided on the second major surface;
   a first insulating layer provided on the second major surface side of each of the semiconductor layers and including a plurality of first openings communicating with the first electrodes and a plurality of second openings communicating with the second electrodes;
   a plurality of first interconnect layers, each of the first interconnect layers provided in the first openings in the first insulating layer and connected to the first electrodes;
   a plurality of second interconnect layers, each of the second interconnect layers provided in the second openings in the first insulating layer and connected to the second electrodes;
   a plurality of first metal pillars, each of the first metal pillars provided on a face of the first interconnect layers opposite to the first electrodes;
   a plurality of second metal pillars, each of the second metal pillars provided on a face of the second interconnect layers opposite to the second electrodes;
   a second insulating layer provided between a side face of the first metal pillars and a side face of the second metal pillars; and
   an inside interconnection provided on the first insulating layer, the inside interconnection connected to the first interconnect layer on a lateral edge of the first interconnect layer; and
   an outer circumferential interconnection provided on an outer circumferential region outside a device region, the plurality of the semiconductor layers being provided on the device region, the outer circumferential interconnection connected to the first interconnect layer via the inside interconnection.

2. The device of claim 1, wherein the inside interconnection connects the first interconnect layer to another first interconnect layer provided next to the first interconnect layer.

3. The device of claim 1, wherein lateral edges of the first interconnect layer are covered with the first insulating layer or the second insulating layer except for a lateral edge contacting to the inside interconnection.

4. The device of claim 1, wherein the second insulating layer is interposed between the second metal pillar and another second metal pillar provided next to the second metal pillar.

5. The device of claim 1, wherein the outer interconnection continuously encloses the device region.

6. The device of claim 1, wherein the outer interconnection and the first interconnect layer are connected via the inside interconnection provided in a dicing region of the device region.

7. The device of claim 6, wherein the outer interconnection is thicker than the inside interconnection.

8. The device of claim 2, wherein lateral edges of the first interconnect layer are covered with the first insulating layer or the second insulating layer except for a lateral edge contacting to the inside interconnection.

* * * * *